United States Patent
Whiteman (12)

(10) Patent No.: US 6,407,562 B1
(45) Date of Patent: Jun. 18, 2002

(54) PROBE TIP TERMINATING DEVICE PROVIDING AN EASILY CHANGEABLE FEED-THROUGH TERMINATION

(75) Inventor: Donald A Whiteman, Colorado Springs, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/354,759

(22) Filed: Jul. 29, 1999

(51) Int. Cl.$^7$ ................................ G01R 31/02
(52) U.S. Cl. .................. 324/754; 324/158.1; 439/482; 333/17
(58) Field of Search ................ 324/754, 755, 324/158.1; 439/482, 481, 675, 578, 620, 76.1; 257/748; 333/17

(56) References Cited

U.S. PATENT DOCUMENTS

| | | | | |
|---|---|---|---|---|
| 2,925,578 A | * | 2/1960 | Huff et al. | 324/158.1 |
| 4,199,736 A | * | 4/1980 | McTaggart et al. | 333/17 |
| 4,740,746 A | * | 4/1988 | Pollock et al. | 324/754 |
| 4,764,723 A | * | 8/1988 | Strid | 324/158.1 |
| 4,932,897 A | * | 6/1990 | Lee et al. | 439/578 |
| 5,041,781 A | * | 8/1991 | Kawada et al. | 324/158.1 |
| 5,045,780 A | * | 9/1991 | Swart | 324/158.1 |
| 5,183,411 A | * | 2/1993 | Yu | 439/578 |
| 5,373,231 A | * | 12/1994 | Boll et al. | 324/158.1 |
| 5,957,717 A | * | 9/1999 | Monsef et al. | 439/339 |
| 6,079,986 A | * | 9/2000 | Beshears | 439/63 |
| 6,184,587 B1 | * | 2/2001 | Khandros et al. | 257/784 |

FOREIGN PATENT DOCUMENTS

| | | |
|---|---|---|
| EP | 0513992 A1 | 6/1992 |
| JP | 08-086808 | 1/1987 |
| JP | 62-021064 | 4/1996 |

OTHER PUBLICATIONS

"Nanosecond Passive Voltage Probes" by Patrick A. McGovern, published in IEEE Transactions On Instrumentation And Measurement, vol. 1M–26, No. 1, Mar. 1977.

"Probes And Transducers", by John D. Lenk, 1994, chapter 5, published in McGraw Hill Electronic Testing Handbook: Procedures And Techniques, pp. 191–196, ISBN 0–07–037602–6(H).

"Probes And Input Circuits", by T.H. O'Dell, 1991 chapter 5, published in Circuits For Electronic Instrumentation, pp. 72–89, published by Cambridge University Press, ISBN 0–521–40428–2.

"Are You Measuring Your Circuit Or Your Scope Probe?" by Andy Frost, Don Whiteman, and Jason Tsai, published in EDN magazine, pp. 53–58, Jul. 22, 1999.

* cited by examiner

Primary Examiner—Safet Metjahic
Assistant Examiner—Jimmy Nguyen
(74) Attorney, Agent, or Firm—Leslie P. Gehman (57) ABSTRACT

A probe tip adapter with easily interchangeable termination. It includes an empty circuit substrate with which the user may construct a probe adapter circuit designed specifically for almost any measurement situation. Also, several standard termination circuits may be easily interchanged by the user to allow the same probe tip adapter to work with transmission lines of different impedance.

41 Claims, 7 Drawing Sheets

PROBE TIP TERMINATING DEVICE PROVIDING AN EASILY CHANGEABLE FEED-THROUGH TERMINATION

FIELD OF THE INVENTION

This invention relates generally to the field of electrical measurement apparatus and, more particularly to a probe assembly for such apparatus.

BACKGROUND OF THE INVENTION

In measuring changing voltage levels within circuits, it is important that the measuring instrument cause as small of effect as possible on the circuit under test. The method of connecting the instrument to the circuit under test should happen in such a way that the performance of the instrument is maintained while having either a very small, or a known effect on the circuit. If measuring changes the voltage in a large or unpredictable way the results are prone to error and are less reliable.

In the electronics industry, it is often necessary to observe a signal driving a transmission line. Usually it is desirable to terminate the line with its characteristic impedance to prevent reflections due to an impedance mismatch. This characteristic impedance used to terminate the line is commonly 50Ω, 75Ω, or 100Ω.

High frequency measuring instruments, such as those used for signals above 100 MHz, often have 50Ω coaxial inputs. Probes used with these instruments often contain a series resistor very close to the probe tip to attenuate the signal down to a level measurable by the instrument. For example, a 10:1 attenuation may be achieved by placing a 450Ω resistor in series in the probe tip. This 450Ω resistor forms a voltage divider with the 50Ω impedance of the terminated probe cable providing a 10:1 attenuation. The 10:1 attenuation occurs because the voltage is measured across the 50Ω impedance of the terminator.

However, when a 10:1 probe is used to measure a source with a 50Ω impedance, problems occur. Ideally, the source would be terminated with 50Ω right at the point of measurement. However, in this case, the probe acts as a 500Ω impedance at the source since the 450Ω discrete resistor and the 50Ω impedance of the line are in series. This 500Ω is then in parallel with the 50Ω terminating resistor at the source to form a 45.5Ω impedance. This impedance mismatch causes reflections at the measurement point. To eliminate those reflections, a terminating resistor must be used to give a 50Ω impedance when connected in parallel with 500Ω. The value of this terminating resistor would be 55.56Ω.

As different attenuating probes are used, the resistance needed to keep reflections from occurring changes. Accordingly, there is a need in the art for a means and a method to allow the precise termination of sources at the point of measurement. It is desirable for this device to be very small to minimize the distance between the probe tip and the terminating resistor. Also, it is desirable for the probe tip adapter to be useable on sources of varying impedance and probes of varying impedance and attenuation.

SUMMARY OF THE INVENTION

This invention provides a probe tip adapter with an easily interchangeable termination. The probe tip adapter in physically situated between the point of an oscilloscope probe and a transmission line connector, such as a BNC, SMA, or SMB connector. By constructing a probe tip adapter containing a small, bare circuit substrate, this invention allows users to design their own custom probe circuits and assemble them using surface mount (or other) devices to create many different probe circuits for use in many different situations. The user may also keep several unmodified probes in reserve. Finally, users may custom construct their own probe circuit quickly, inexpensively, and easily.

DETAILED DESCRIPTION OF THE PREFERRED EMBODIMENTS

In the preferred embodiment, a small probe tip adapter is manufactured with a transmission line connector (such as BNC, SMA, or SMB) at one end and a small receptacle at the other end into which a probe tip may be fit with a friction fit. Those knowledgeable in the art will recognize that the probe tip receptacle may be modified as needed to accommodate different sizes and styles of probe tips. Also, the connector may be modified as needed for a specific application.

Figure 1:
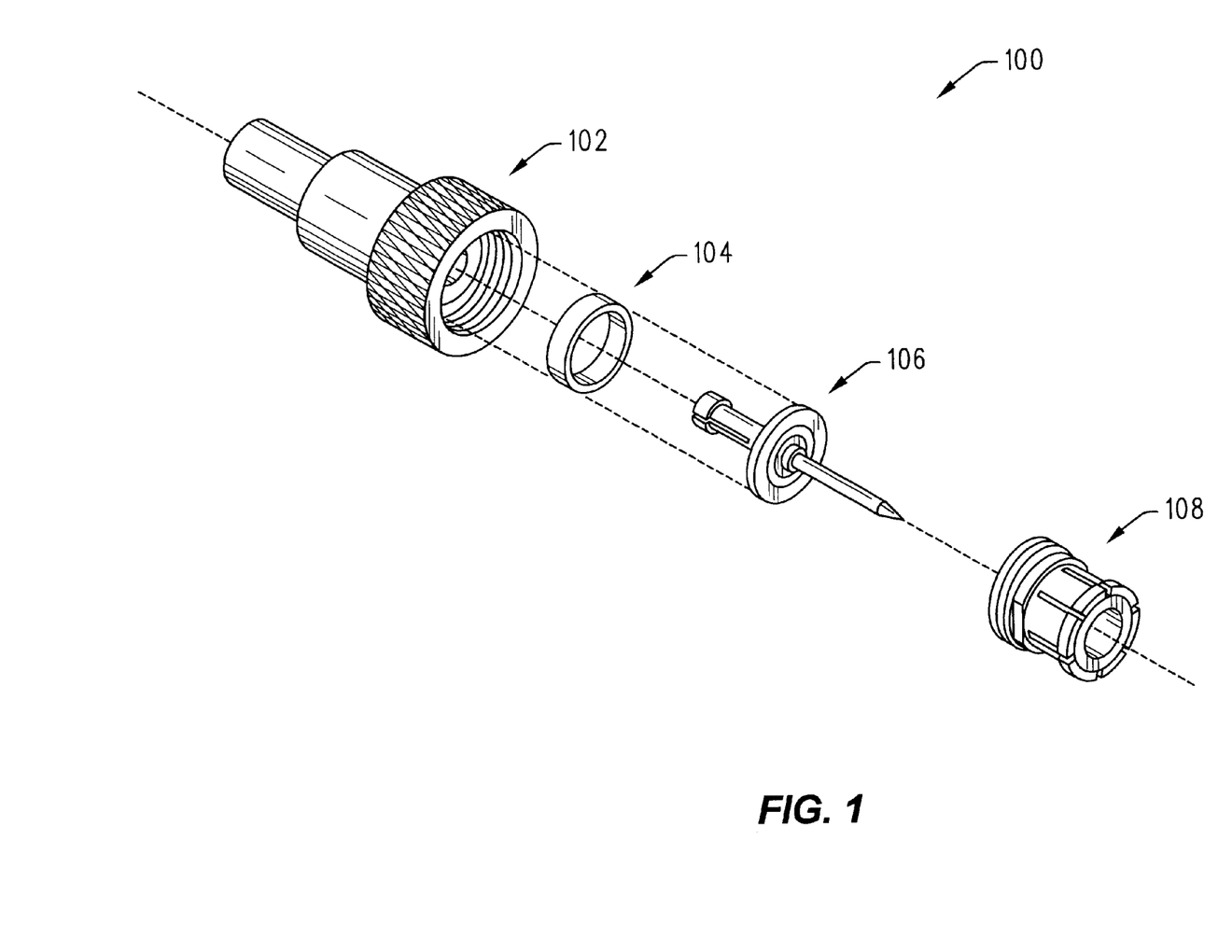
FIG. 1 is an assembly diagram of a probe tip adapter for use with a user designed and constructed probe tip circuit.
Figure 2:
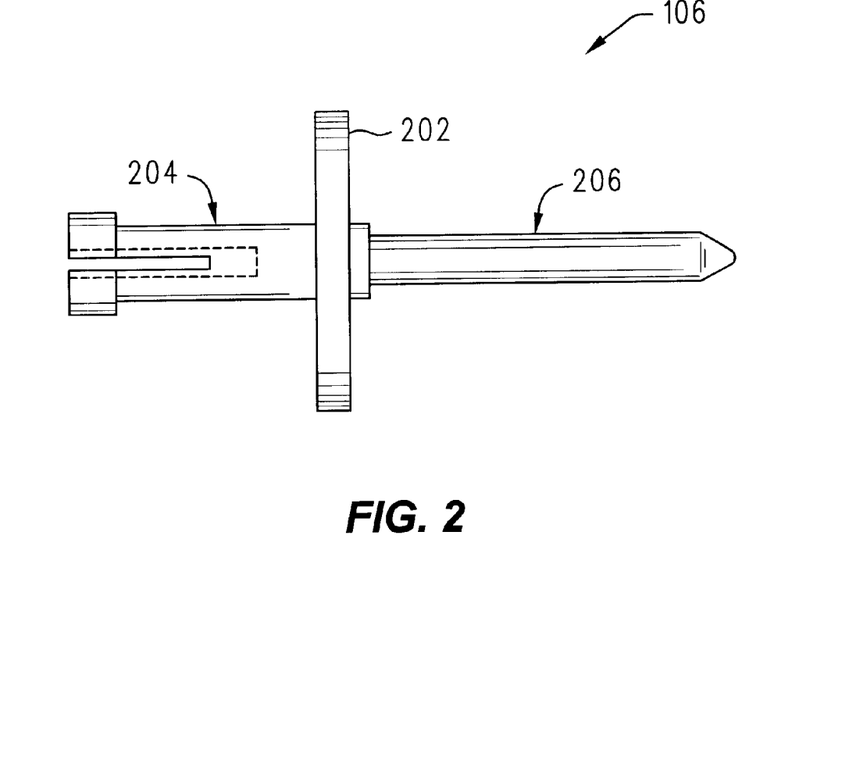
FIG. 2 is an enlargement of the circuit substrate assembly 106.
Figure 3:
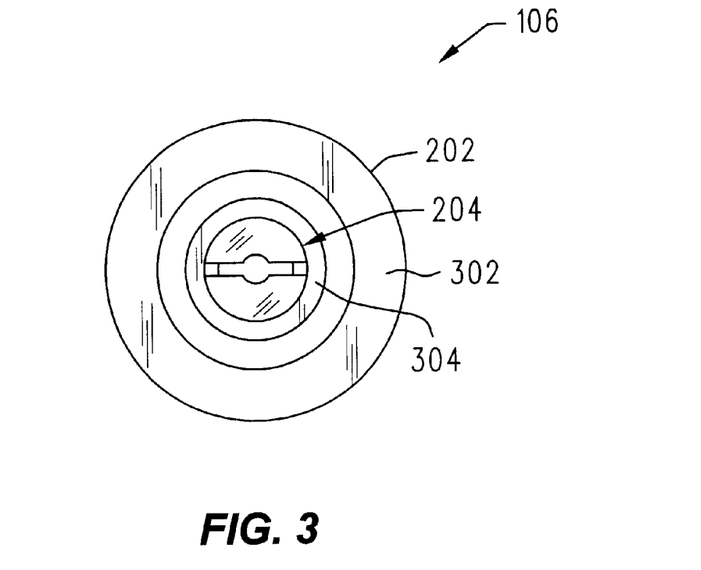
FIG. 3 is an end view of the circuit substrate assembly 106 viewed from the probe tip adapter side.

In FIG. 1 a user configurable probe tip adapter 100 is shown in an assembly diagram format. Element 108 is a BNC connector which threads into the probe tip adapter housing 102. The BNC connector 108 has male threads that mate with the female threads of the probe tip adapter housing 102. This BNC connector 108 comprises a nonpermanent connection to the transmission line or cable that is being measured. When the BNC connector 108 is connected to the probe tip adapter housing 102 a cavity is left in the center where the circuit substrate assembly 106 will rest. Fitting within the probe tip adapter housing 102, are a conducting spacer ring 104, and a circuit substrate assembly 106. The circuit substrate assembly 106 includes the receptacle that the probe tip fits into, along with the pin of the BNC connector 206 in FIG. 2. The circuit substrate assembly 106 is shown in more detail in FIG. 2. The circuit substrate 202 is disc shaped with two concentric rings of conducting material on one surface and a small hole drilled through the center. The hole forms the inner diameter of the inner concentric ring of conducting material. When the probe tip adapter is assembled the spacer ring 104 electrically connects the outer ring to the case of the probe tip adapter assembly. A pin 204 is friction fit through a hole in a circuit substrate 202 to build the circuit substrate assembly 106. One end of the pin 204 is drilled out to a diameter slightly smaller than that of a standard probe tip. This end of the pin 204 is then slotted to a depth of about ¾ that of the drilled hole. This allows the probe tip to be friction fit within the pin 204, providing good electrical contact to the pin 204. This tip node is the point at which the probe tip adapter is coupled to the probe tip. The pin 204, 206 in the preferred embodiment is made of brass, however, those skilled in the art will recognize that other materials may be use to construct the pin. The pointed end of the brass pin 206 becomes the center pin of the BNC connector in this embodiment of the invention, when assembled. FIG. 3 shows an end view of the circuit substrate assembly 106 from the probe tip side of the assembly. In this configuration of the circuit substrate 202, two concentric rings of conducting material 302 and 304 are left on the substrate. The inner ring of conducting material 304 is electrically connected to the brass pin 204, 206. The outer ring of conducting material 302 is electrically connected to the case of the BNC connector 108 and the case of the probe tip adapter 102 through the spacer ring 104 when the probe tip is assembled. This allows the user to solder surface mount devices between the inner and outer rings of conducting material 302 and 304 to create an electrical circuit between the probe tip and the case (or ground) conductor.

This structure allows a user to solder surface mount devices to the circuit substrate to custom match their probe to the circuit under test and the measuring instrument. This structure may also be constructed using other materials. For example the BNC connector may be replaced with a different type of connector such as a SMA or SMB connector. Also, one of ordinary skill in the art will recognize that various types of circuit substrate such as a printed circuit board, copper clad fiberglass, ceramic, or silicon nitride may be used in this configuration. The circuit substrate may use through plating techniques to improve performance. For example, plating the hole through the center may allow a better electrical contact to the probe tip.

Other possible embodiments of this invention include constructing the circuit substrate in such a way as to allow the use of active components, such as integrated circuits or microwave circuits. This allows the use of active termination in a small custom-designed probe circuit. Circuitry such as a receiver may also be envisioned within one of these probe tip adapters. Also, other embodiments may construct the circuit substrate in shapes other than a disk. For example, in some embodiments, it may be useful to notch or key the substrate to prevent any rotation within the probe tip adapter.

Figure 4:
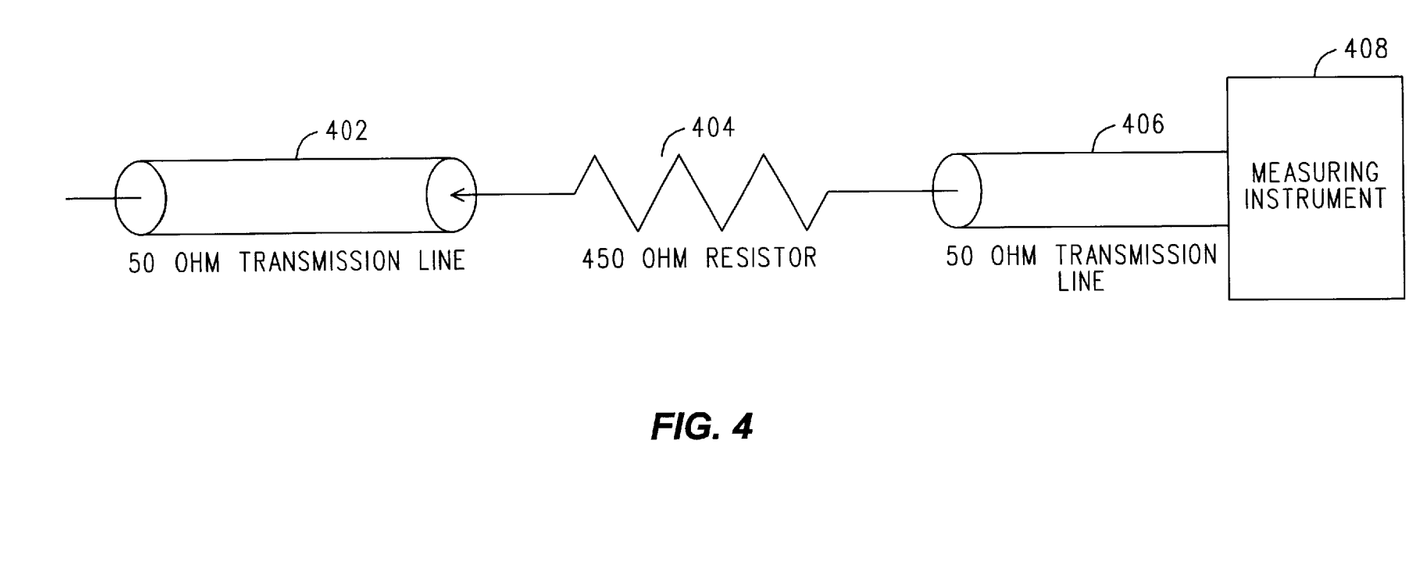
FIG. 4 is a schematic representation of a 10:1 attenuating 50Ω probe measuring a source within a 50Ω transmission line.
Figure 5:
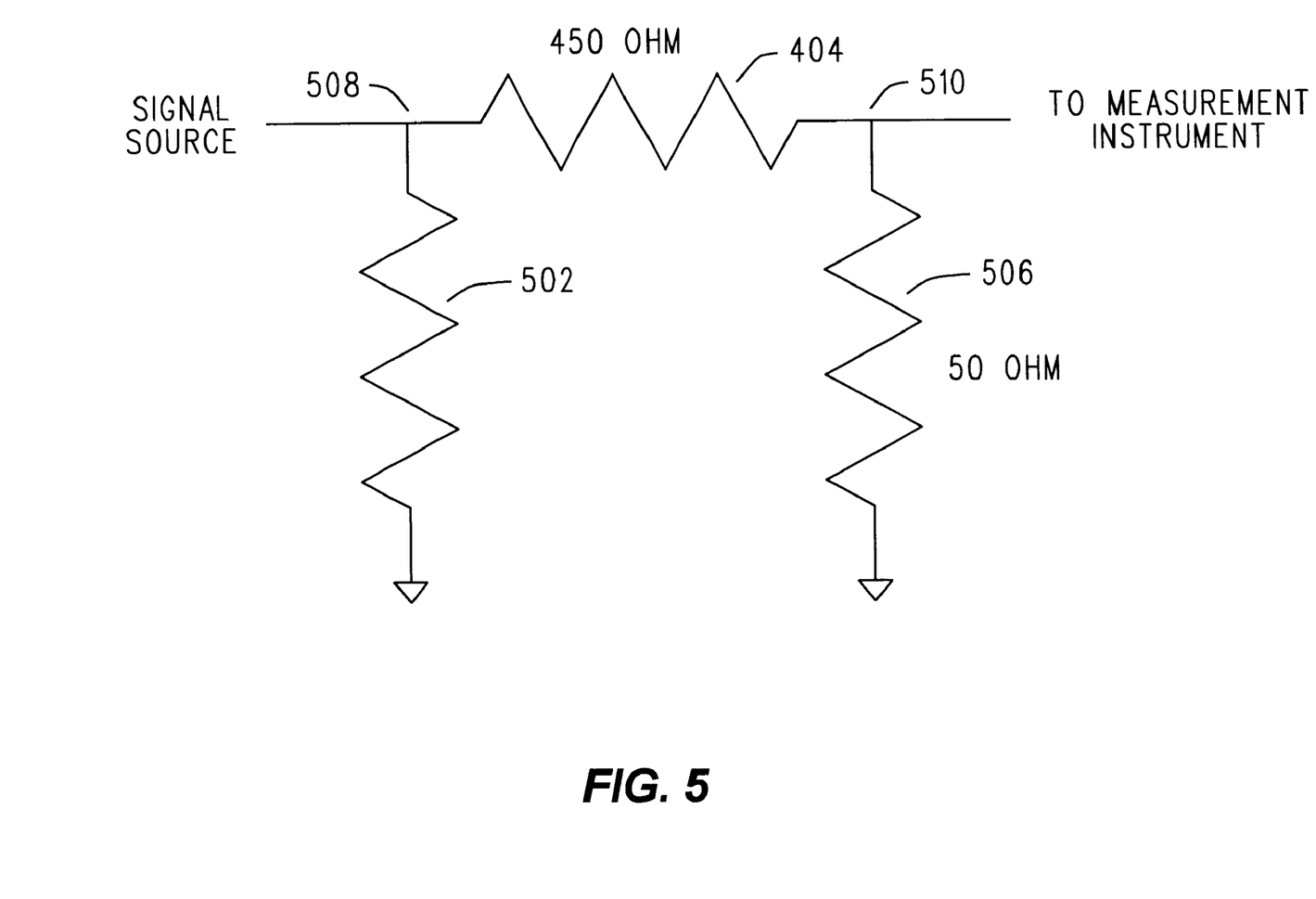
FIG. 5 is a schematic representation of a probe measuring the same circuit with the probe tip adapter circuit designed to match the 500Ω impedance of the circuit to the 50Ω impedance of the transmission line.

One use of this invention is shown in FIG. 4 and FIG. 5. FIG. 4 shows a measuring instrument 408 using a 10:1 attenuating 50Ω impedance probe 406 to measure a source within a 50Ω transmission line 402. The 450Ω resistor 404 is a discrete device contained within the probe tip. This resistor is placed as close as possible to the probe tip. FIG. 5 is a schematic representation of the measurement configuration from FIG. 4. The 450Ω resistor 404 is shown in series with the 50Ω impedance 506 of the probe. The measuring instrument is connected at node 510. From this schematic the 10:1 attenuation is present from the voltage divider created by the 450Ω resistor 404 and the 50Ω impedance 506. The probe is connected to the signal source at node 508 and the terminating resistor of the signal source is shown as element 502.

If a standard terminating adapter is used, the terminating resistor 502 will have a value of 50Ω. This 50Ω is then in parallel with the 450Ω resistor and the 50Ω impedance and the effective resistance at the point where is signal source is measured 508 is 45.45Ω. This causes reflections in the measurement setup and may cause errors in high frequency measurements. To eliminate these reflections, the terminating resistor 502 must have a value to create an effective 50Ω termination when connected in parallel to the 450Ω probe tip resistor 404 and the 50Ω probe impedance. This required value is 55.55Ω which is not a standard resistor value, however by connecting two 169Ω resistors in parallel with a 162Ω resistor, an impedance of 55.53Ω is created. This impedance in parallel with 500Ω creates an impedance of 49.98Ω that is within 0.04% of the desired 50Ω impedance.

Figure 6:
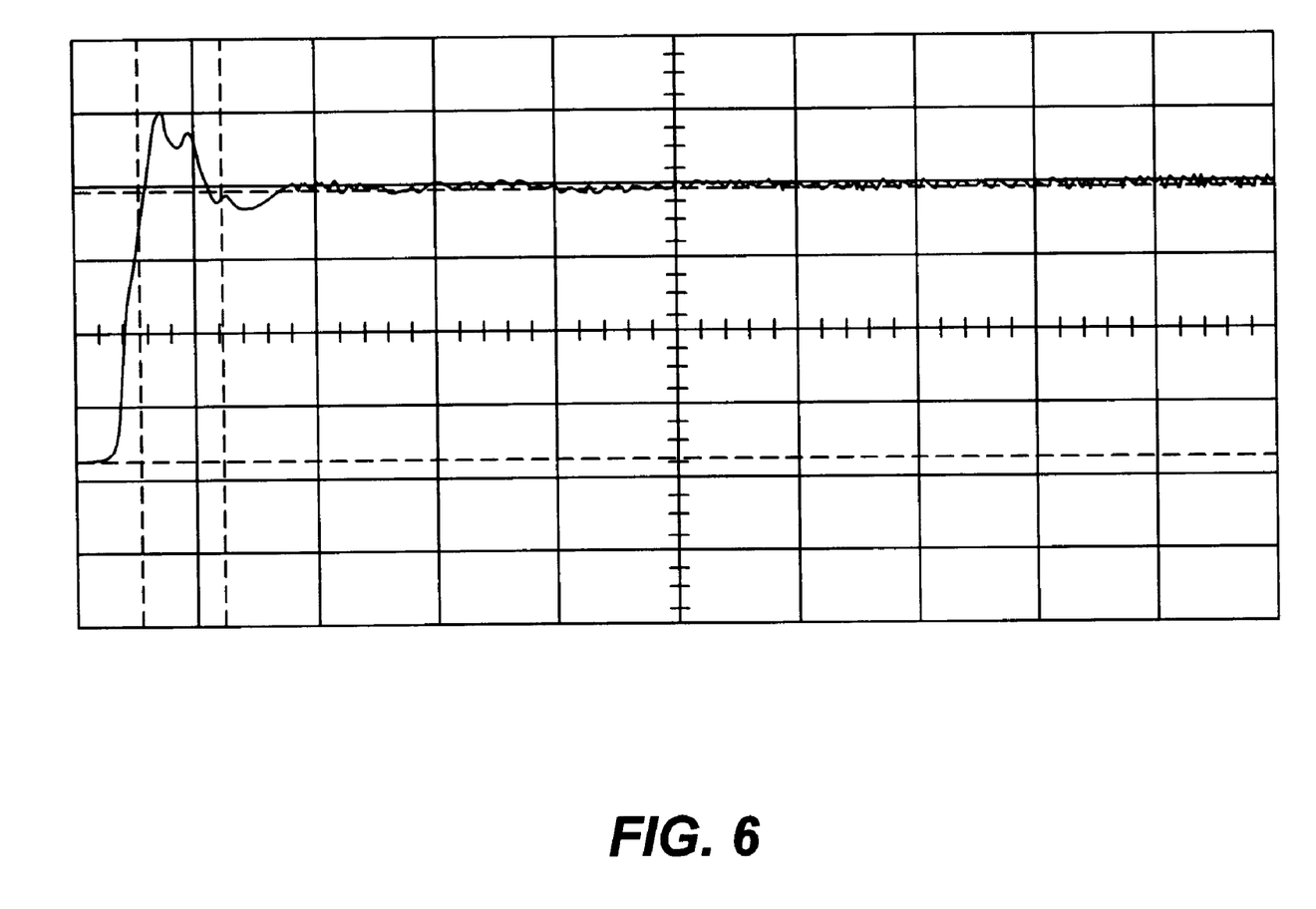
FIG. 6 is an illustration of an oscilloscope trace of a measurement made using a prior art probe termination adapter.

FIG. 6 shows the oscilloscope output of a step function when measured using an HP1163A probe (Hewlett-Packard Company, Palo Alto, Calif.) and a large version of the 50Ω HP10100C terminating adapter (Hewlett-Packard Company, Palo Alto, Calif.). The HP1163A probe has a significant unmatched segment from the tip to the probe tip divider resistor, causing the overshoot seen in FIG. 6.

Figure 7:
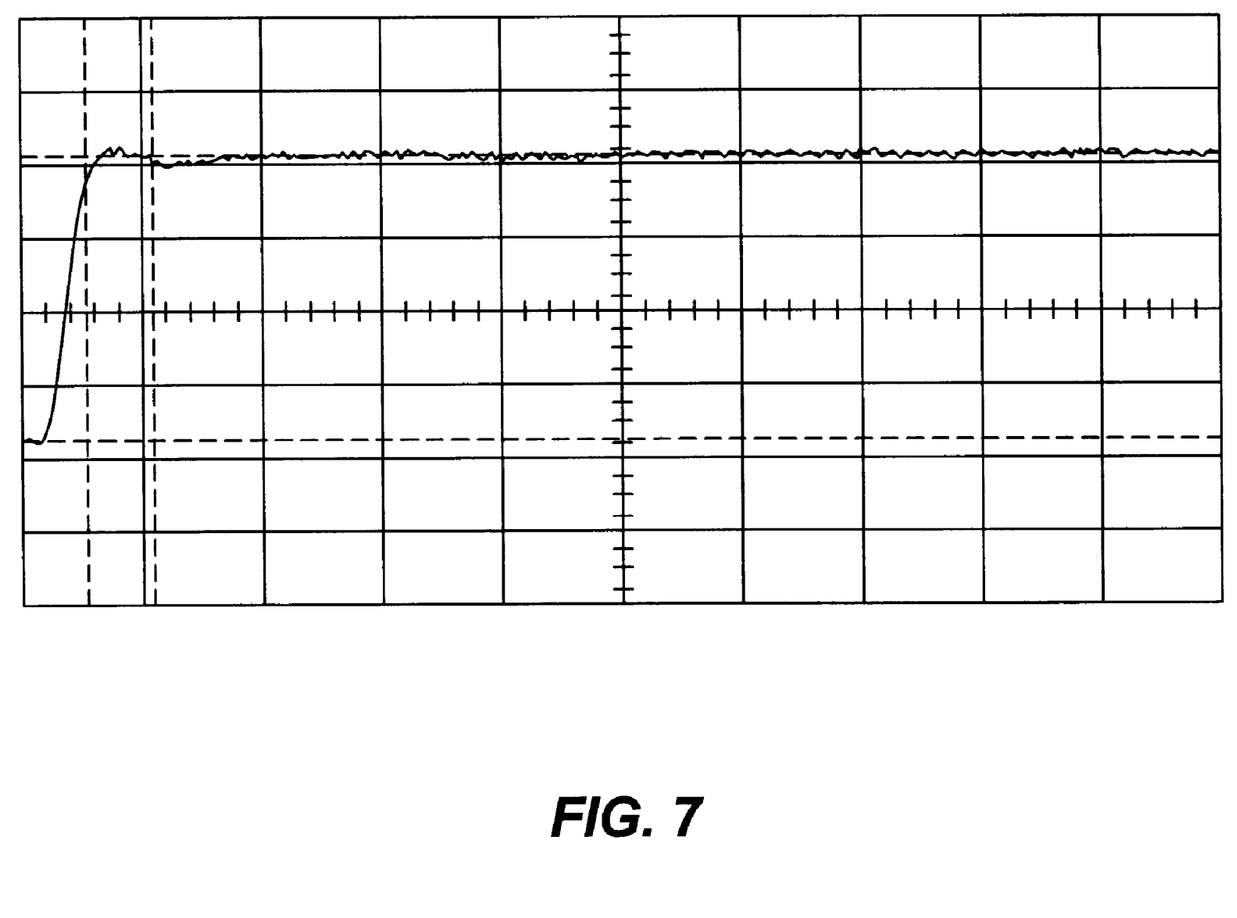
FIG. 7 is an illustration of an oscilloscope trace of the same measurement as FIG. 6 using this invention.

When the same circuit as FIG. 6 is measured with a custom made probe tip adapter as described in this document, the measured signal is significantly cleaner, as can be seen in FIG. 7. This is due to the elimination of impedance mismatches between the probe and the probe tip adapter.

Figure 8:
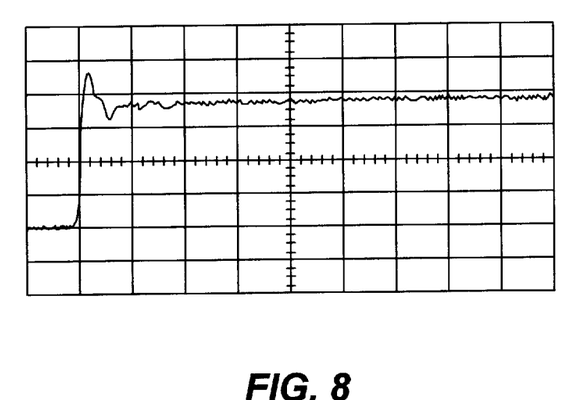
FIG. 8 is an illustration of measured step response using a conventional 50 ohm feed-through termination.
Figure 9:
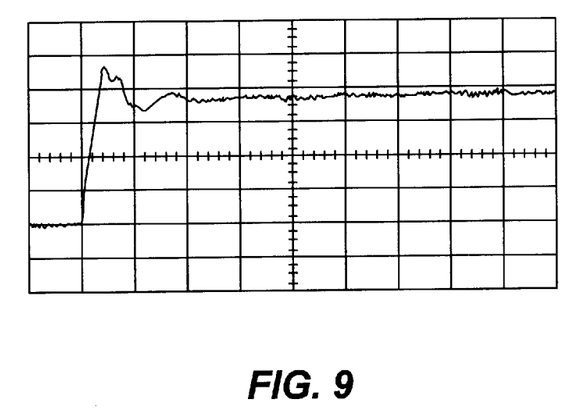
FIG. 9 is an illustration of a measured step response using a similar 50 ohm feed-through termination as that of FIG. 8.
Figure 10:
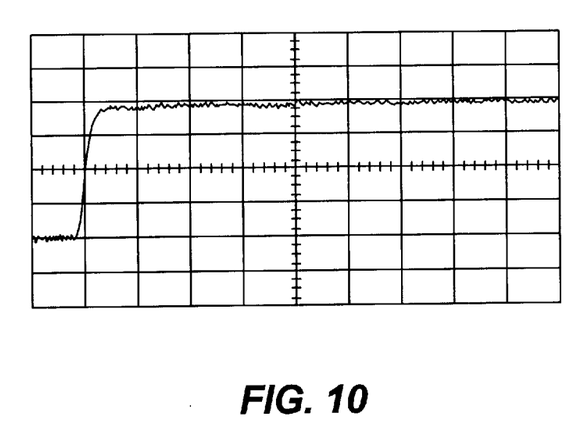
FIG. 10 is an example of the measured step response of FIGS. 8 and 9 using the probe tip adapter of FIG. 1.

FIG. 8 and FIG. 9 are illustrations of the measured response of a step function through a fixed 50Ω feed-through termination currently available commercially (HP10100C, Hewlett-Packard Company, Palo Alto, Calif.), driven with the time domain reflectometer (TDR) output of a HP54120A digitizing oscilloscope (Hewlett-Packard Company, Palo Alto, Calif.), and using a 500Ω HP54006A probe (Hewlett-Packard Company, Palo Alto, Calif.). In FIG. 8, the small version of the HP10100C was used, and in FIG. 9 the large version of the HP10100C was used. FIG. 10 shows the response when a properly designed changeable terminating device as described in this document is inserted in place of the HP10100C termination. Note that both FIG. 8 and FIG. 9 have substantial over shoot of the step response and some ringing. While in FIG. 10 the over shoot and ringing are gone, leaving a smooth step response.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An electronic instrument probe tip adapter, comprising:
   a housing comprising a housing electrically conductive portion;
   an electrically conductive tip at least partially located within said housing; and
   a circuit substrate located within said housing, said circuit substrate comprising a first conductive portion and a second conductive portion separated by an insulative portion;

said circuit substrate first conductive portion being electrically connected to said tip; and said circuit substrate second conductive portion being electrically connected to said housing electrically conductive portion.

2. A probe tip adapter as recited in claim 1, wherein said circuit substrate is a printed circuit board.

3. A probe tip adapter as recited in claim 1, wherein said probe tip adapter is operatively associated with a BNC connector.

4. A probe tip adapter as recited in claim 1, wherein said circuit substrate is ceramic.

5. A probe tip adapter as recited in claim 1, wherein said circuit substrate is copper clad fiberglass.

6. A probe tip adapter as recited in claim 1, wherein said probe tip adapter is operatively associated with an SMA connector.

7. A probe tip adapter as recited in claim 1, wherein said probe tip adapter is operatively associated with an SMB connector.

8. A probe tip adapter as recited in claim 1, wherein said circuit substrate has a hole formed therein and wherein said tip extends through said hole.

9. A probe tip adapter as recited in claim 8, wherein said circuit substrate first conductive portion is electrically connected to said hole and said tip.

10. A probe tip adapter as recited in claim 1, wherein said circuit substrate second conductive portion at least partially encompasses said circuit substrate first conductive portion.

11. A probe tip adapter as recited in claim 1 and further comprising at least one electronic component electrically connected between said circuit substrate first conductive portion and said circuit substrate second conductive portion.

12. A probe tip adapter as recited in claim 11, wherein said at least one electronic component is passive.

13. A probe tip adapter as recited in claim 11, wherein said at least one electronic component is active.

14. A probe tip adapter as recited in claim 11, wherein said at least one electronic component is a resistor.

15. A probe tip adapter as recited in claim 11, wherein said at least one electronic component is a capacitor.

16. A probe tip adapter as recited in claim 11, wherein said at least one electronic component is an inductor.

17. A probe tip adapter as recited in claim 1 and further comprising a housing having a cavity formed therein, said circuit substrate being located within said cavity.

18. A probe tip adapter as recited in claim 17, and further comprising an electrically conductive spacer contacting said housing electrically conductive portion and said circuit substrate second electrically conductive portion.

19. A probe tip adapter as recited in claim 18 wherein said spacer is a ring.

20. A method of electrically matching an electronic probe to a circuit said method comprising:

providing an electronic probe having a first conductor and a second conductor;

providing a circuit substrate, said circuit substrate having a first conductive portion, a second conductive portion, and an insulative portion located between said first conductive portion and said second conductive portion, said second conductive portion at least partially encompassing said first conductive portion, said circuit substrate first conductive portion being electrically connected to said electronic probe first conductor, said circuit substrate second conductive portion being electrically connected to said electronic probe second conductor; and electrically connecting an electronic component between said circuit substrate first conductive portion and said circuit substrate second conductive portion.

21. A method as recited in claim 20, wherein said circuit substrate is a printed circuit board.

22. A method as recited in claim 20, wherein said electronic probe is operatively associated with a BNC connector.

23. A method as recited in claim 20, wherein said circuit substrate is ceramic.

24. A method as recited in claim 20, wherein said circuit substrate is copper clad fiberglass.

25. A method as recited in claim 20, wherein said electronic probe is operatively associated with an SMA connector.

26. A method as recited in claim 20, wherein said electronic probe is operatively associated with an SMB connector.

27. A method as recited in claim 20, wherein said electrically connecting comprises electrically connecting active electronic component between said substrate first conductive portion and said substrate second conductive portion.

28. A method as recited in claim 20, wherein said electrically connecting comprises electrically connecting a resistor between said substrate first conductive portion and said substrate second conductive portion.

29. A method as recited in claim 20, wherein said electrically connecting comprises electrically connecting a capacitor between said substrate first conductive portion and said substrate second conductive portion.

30. A method as recited in claim 20, wherein said electrically connecting comprises electrically connecting an inductor between said substrate first conductive portion and said substrate second conductive portion.

31. An apparatus comprising:

a housing having a first conductor and a second conductor associated therewith; and a circuit substrate having a first conductive portion, a second conductive portion, and an insulative portion located between said first conductive portion and said second conductive portion, said second conductive portion at least partially encompassing said first conductive portion, said printed circuit board first conductive portion being electrically connected to said housing first conductor, said printed circuit board second conductive portion being electrically connected to said housing second conductor.

32. An apparatus as recited in claim 31, wherein said circuit substrate is a printed circuit board.

33. An apparatus as recited in claim 31, wherein said circuit substrate is ceramic.

34. An apparatus as recited in claim 31 wherein said circuit substrate is copper clad fiberglass.

35. An apparatus as recited in claim 31, and further comprising at least one passive electrical component electrically connected between said circuit substrate first conductive portion and said circuit substrate second conductive portion.

36. An apparatus as recited in claim 31, and further comprising at least one active electrical component electrically connected between said circuit substrate first conductive portion and said circuit substrate second conductive portion.

37. An apparatus as recited in claim 31, wherein said circuit substrate first conductive portion is adapted to operate at a voltage relative to said circuit substrate second conductive portion.

38. An apparatus as recited in claim 31, wherein said housing comprises a BNC connector.

39. An apparatus as recited in claim 31, wherein said housing comprises an SMA connector.

40. An apparatus as recited in claim 31, wherein said housing comprises an SMB connector.

41. An electronic instrument probe tip adapter comprising:
- a housing having a conductive portion;
- a tip node extending through said housing;
- a circuit substrate located within said housing, wherein said circuit substrate includes two concentric rings of conductive material, wherein the inner ring of conductive material is electrically connected to said tip node, and wherein the outer ring of conductive material is electrically connected to said housing conductive portion.

* * * * *